United States Patent [19]
Burkes et al.

[11] Patent Number: 5,659,704
[45] Date of Patent: Aug. 19, 1997

[54] METHODS AND SYSTEM FOR RESERVING STORAGE SPACE FOR DATA MIGRATION IN A REDUNDANT HIERARCHIC DATA STORAGE SYSTEM BY DYNAMICALLY COMPUTING MAXIMUM STORAGE SPACE FOR MIRROR REDUNDANCY

[75] Inventors: Theresa A. Burkes, Meridian; Bryan M. Diamond; Marvin D. Nelson, both of Boise, all of Id.

[73] Assignee: Hewlett-Packard Company, Palo Alto, Calif.

[21] Appl. No.: 348,391

[22] Filed: Dec. 2, 1994

[51] Int. Cl.$^6$ ................................................ G06F 12/16
[52] U.S. Cl. .................................... 395/441; 395/182.04
[58] Field of Search ........................... 395/441, 182.04, 395/182.05, 416, 417; 371/10.1, 10.2

[56] References Cited

U.S. PATENT DOCUMENTS

| | | | |
|---|---|---|---|
| 5,155,835 | 10/1992 | Belsan | 395/441 |
| 5,195,100 | 3/1993 | Katz et al. | 395/182.2 |
| 5,237,658 | 8/1993 | Walker et al. | 395/858 |
| 5,249,279 | 9/1993 | Schmenk et al. | 395/825 |
| 5,278,838 | 1/1994 | Ng et al. | 395/182.04 |
| 5,287,462 | 2/1994 | Jibbe et al. | 395/856 |
| 5,289,418 | 2/1994 | Youngerth | 365/201 |
| 5,297,258 | 3/1994 | Hale et al. | 395/441 |
| 5,301,297 | 4/1994 | Menon et al. | 395/441 |
| 5,392,244 | 2/1995 | Jacobson et al. | 395/441 |
| 5,455,934 | 10/1995 | Holland et al. | 395/404 |
| 5,479,653 | 12/1995 | Jones | 395/182.03 |
| 5,485,571 | 1/1996 | Menon | 395/182.05 |
| 5,491,810 | 2/1996 | Allen | 395/444 |
| 5,519,844 | 5/1996 | Stallmo | 395/441 |
| 5,546,558 | 8/1996 | Jacobson et al. | 395/441 |
| 5,568,629 | 10/1996 | Gentry et al. | 395/441 |
| 5,572,661 | 11/1996 | Jacobson | 395/182.05 |
| 5,574,851 | 11/1996 | Rathunde | 395/182.05 |
| 5,596,709 | 1/1997 | Bond et al. | 395/182.05 |
| 5,598,549 | 1/1997 | Rathunde | 395/441 |

*Primary Examiner*—Tod R. Swann
*Assistant Examiner*—Keith W. Saunders

[57] ABSTRACT

A hierarchic disk array data storage system has multiple storage disks that define a physical storage space and a RAID management system that maps the physical storage space into two virtual storage spaces. The RAID-level virtual storage space presents the physical storage space as mirror and parity RAID areas where the mirror RAID areas contain mirror allocation blocks to store data according to RAID Level 1 and the parity RAID areas contain parity allocation blocks to store data according to RAID Level 5. The application-level virtual storage space presents the physical storage space as multiple virtual blocks. The RAID management system migrates data between the mirror and parity RAID areas to optimize performance and reliability. To ensure that sufficient space is retained for this migration, the RAID management system limits the number of virtual blocks that are allocated in the mirror RAID areas. The maximum number of virtual blocks in mirror RAID areas is dynamically computed based upon a function of the physical capacity of the storage disks, the number of storage disks, and the allocated capacity at the time of each storage request from the user.

20 Claims, 7 Drawing Sheets

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T-1 | T-1' | T | T' | S |

FIG. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R-2 | R-1 | R | Q |

FIG. 3

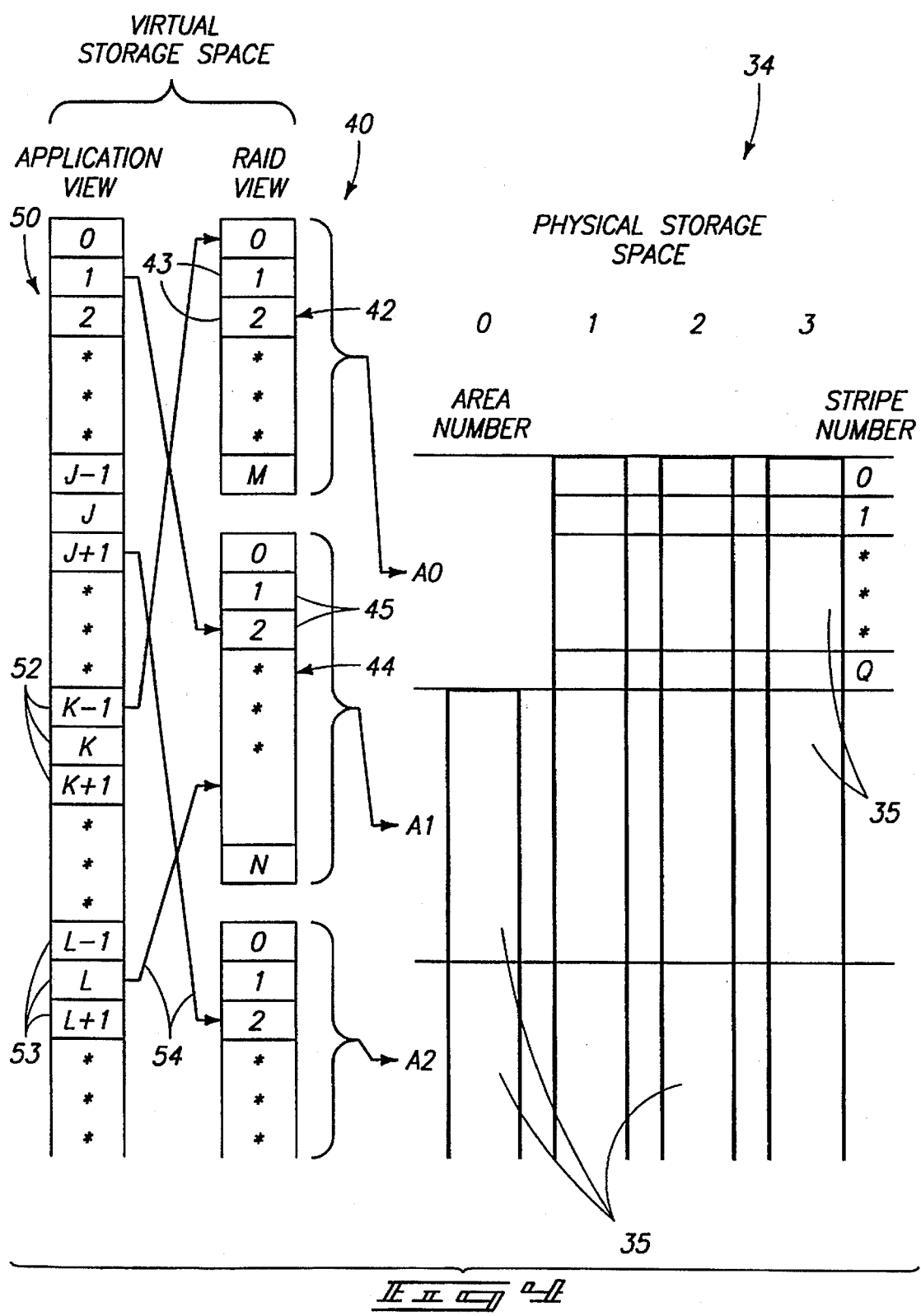

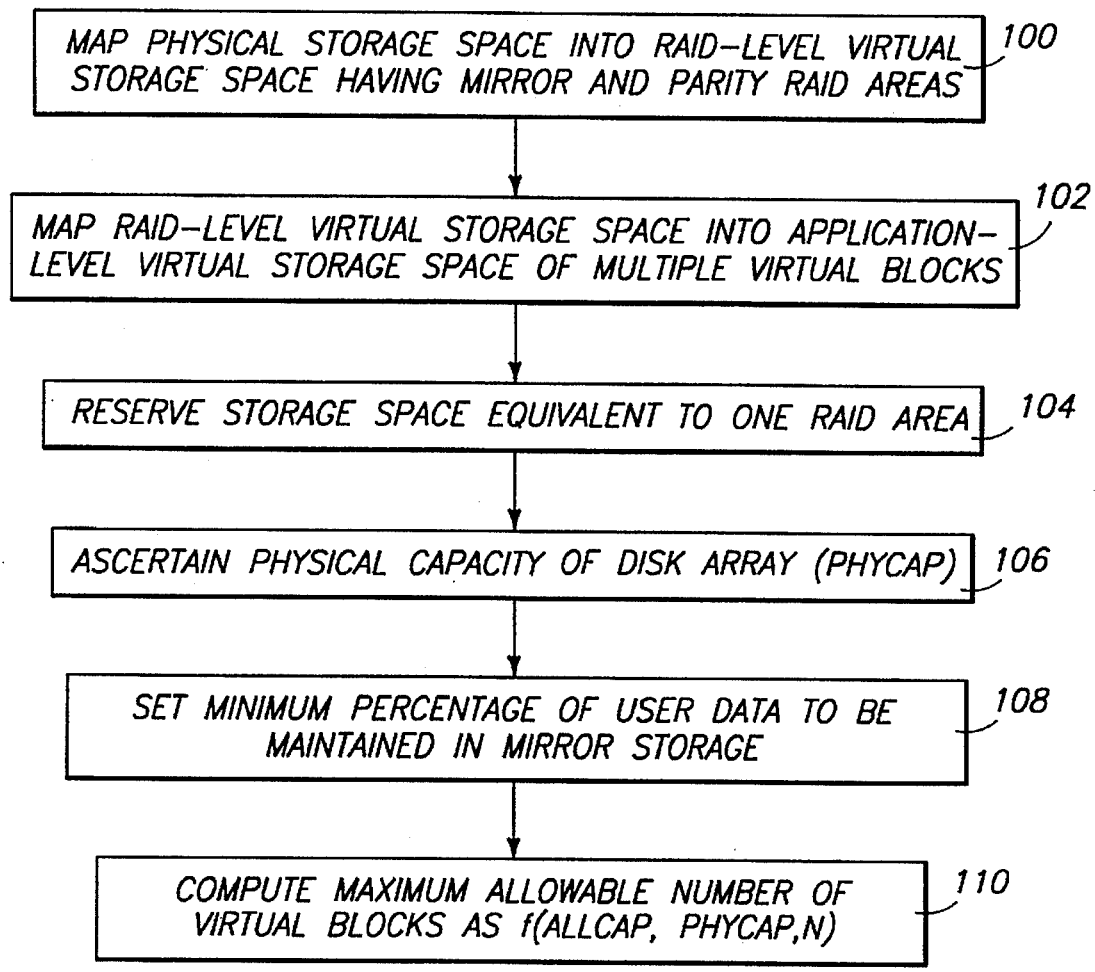

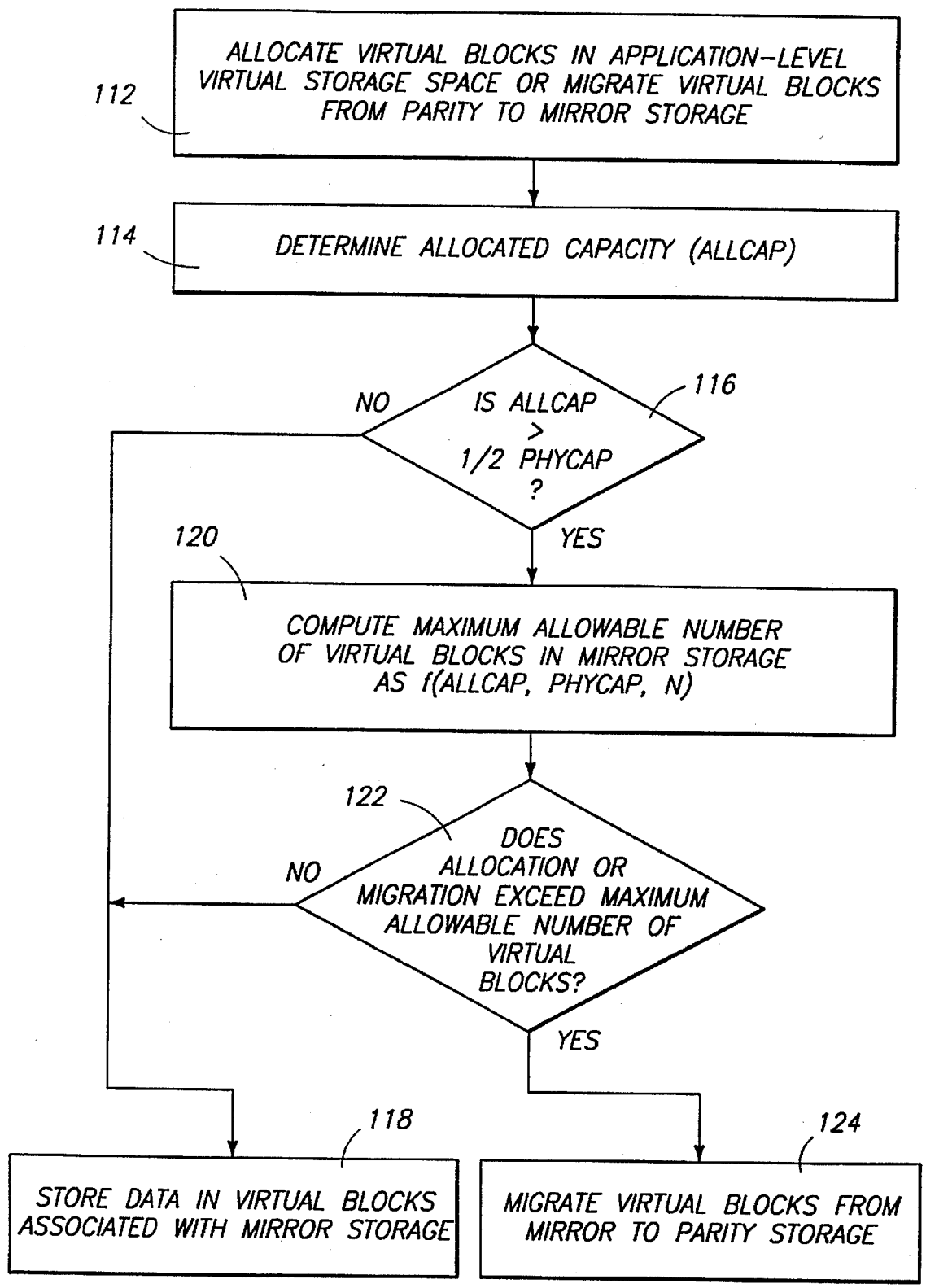

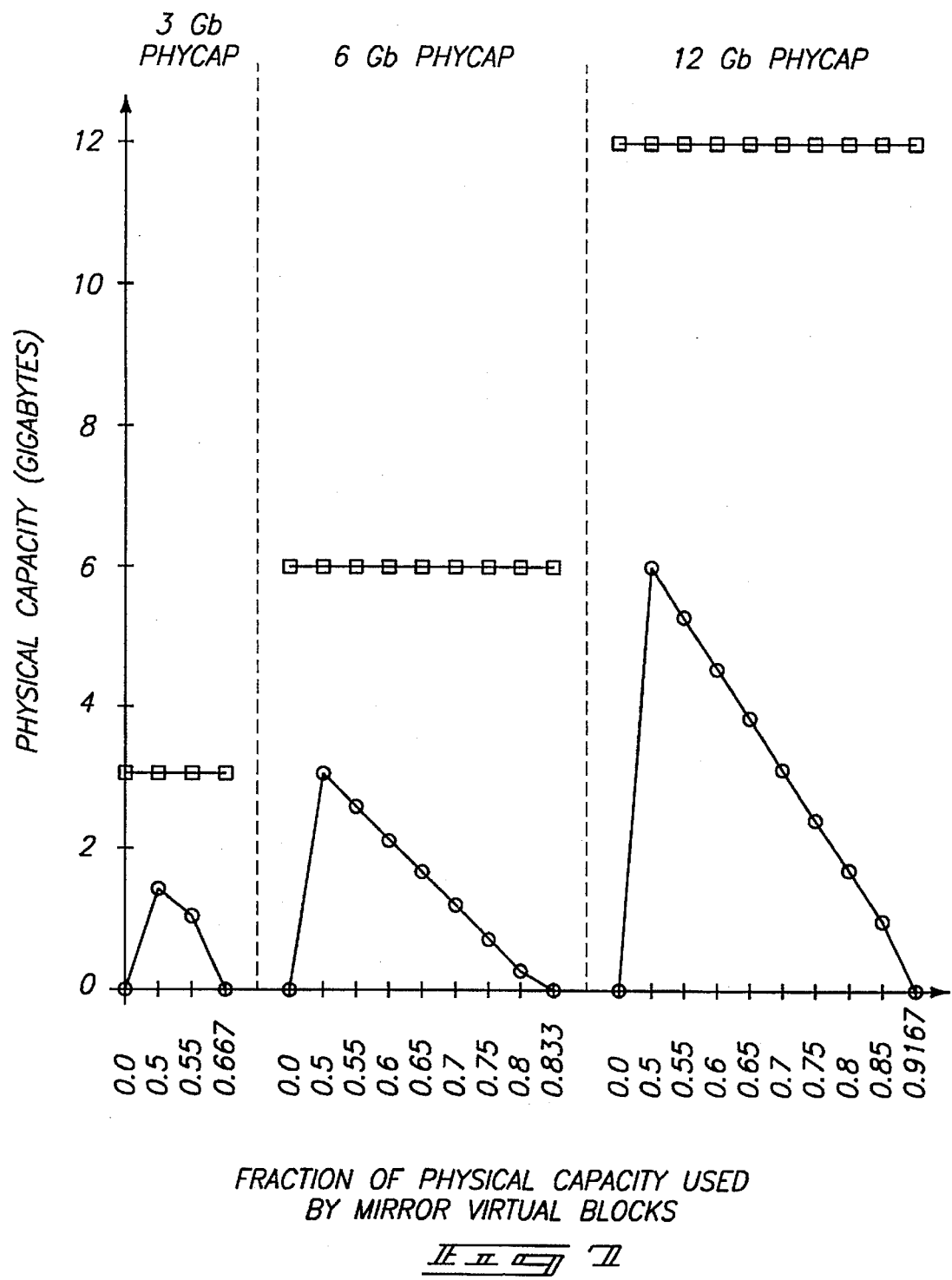

FRACTION OF PHYSICAL CAPACITY USED
BY MIRROR AND PARITY VIRTUAL BLOCKS

METHODS AND SYSTEM FOR RESERVING STORAGE SPACE FOR DATA MIGRATION IN A REDUNDANT HIERARCHIC DATA STORAGE SYSTEM BY DYNAMICALLY COMPUTING MAXIMUM STORAGE SPACE FOR MIRROR REDUNDANCY

FIELD OF THE INVENTION

This invention relates to methods for reserving storage space for data migration in a redundant hierarchic data storage system. This invention also relates to a hierarchic data storage system itself.

BACKGROUND OF THE INVENTION

Computer systems are constantly improving in terms of speed, reliability, and processing capability. As a result, computers are able to handle more complex and sophisticated applications. As computers improve, performance demands placed on mass storage and input/output (I/O) devices increase. There is a continuing need to design mass storage systems that keep pace in terms of performance with evolving computer systems.

This invention particularly concerns the mass storage systems of the disk array type. Disk array data storage system have multiple storage disk drive devices which are arranged and coordinated to form a single mass storage system. There are three primary design criteria for mass storage systems: cost, performance, and availability. It is most desirable to produce memory devices that have a low cost per megabyte, a high input/output performance, and high data availability. "Availability" is the ability to access data stored in the storage system and the ability to insure continued operation in the event of some failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

SUMMARY OF THE INVENTION

This invention provides a hierarchic data storage system that stores data according to different redundancy techniques to optimize performance and reliability. The data storage system includes a disk array having a plurality of storage disks and a disk array controller which coordinates data transfer to and from the disks. The storage disks define a physical storage space. The data storage system also includes a RAID (Redundant Array of Independent Disks) management system operatively coupled to the disk array controller for mapping two virtual storage spaces onto the physical storage space of the storage disks. The first or RAID-level virtual storage space presents the physical storage space as mirror and parity RAID areas that store data according to RAID Level 1 (mirror redundancy) and RAID Level 5 (parity redundancy). The mirror RAID areas contain multiple mirror allocation blocks and the parity RAID areas contain multiple parity allocation blocks. The second or application-level virtual storage space presents the physical storage space as multiple virtual blocks. The virtual blocks are associated with the mirror and parity allocation blocks via pointers kept in a virtual block table.

Initially, the RAID management system stores all data in mirror RAID areas because mirror redundancy affords higher performance and reliability than parity redundancy. All data can be stored in mirror RAID areas until the allocated capacity (i.e., the amount of user data stored in the virtual blocks of the application-level virtual storage space) exceeds one-half the total physical capacity of the disk array. After exceeding this threshold, the RAID management system begins to store some data in parity RAID areas. The RAID management system migrates data between the mirror and parity RAID areas so the data undergoes a change in redundancy between RAID Level 1 (i.e., mirror redundancy) and RAID Level 5 (i.e., parity redundancy) in a manner which optimizes performance and reliability.

To ensure that sufficient space is retained for this migration, the RAID management system limits the number of virtual blocks that can be allocated in the mirror RAID areas. The maximum number of virtual blocks in mirror RAID areas is dynamically computed based upon a function of the physical capacity of the storage disks, the number of storage disks, and the allocated capacity at the time of each storage request from the user.

DESCRIPTION OF THE DRAWINGS

Preferred embodiments of the invention are described below with reference to the following accompanying drawings depicting examples embodying the best mode for practicing the invention.

FIG. 2 is a diagrammatic illustration of storage space on multiple storage disks and shows data storage according RAID Level 1.

FIG. 3 is a diagrammatic illustration of storage space on multiple storage disks and shows data storage according RAID Level 5.

FIG. 4 is a diagrammatic illustration of a memory mapping arrangement of this invention where two virtual storage spaces are mapped onto a physical storage space.

FIG. 5 is a flow diagram of a system initialization method for reserving storage space for data migration according to one aspect of this invention.

FIG. 6 is a flow diagram of a method for ensuring that virtual blocks stored in mirror storage remain below a maximum allowable number.

FIG. 7 is a graph illustrating a maximum allowable number of virtual blocks stored in mirror storage in relation to the fractional amount of physical capacity being used to store data. The graphical information in FIG. 7 is based upon a homogeneous disk array and shows cases for three different physical capacities.

FIG. 8 is a graph illustrating the number of allocated virtual blocks stored in both mirror and parity storage in relation to the fractional amount of physical capacity being used for data storage. The graphical information in FIG. 8 is based upon a heterogeneous disk array and shows cases for three different physical capacities.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
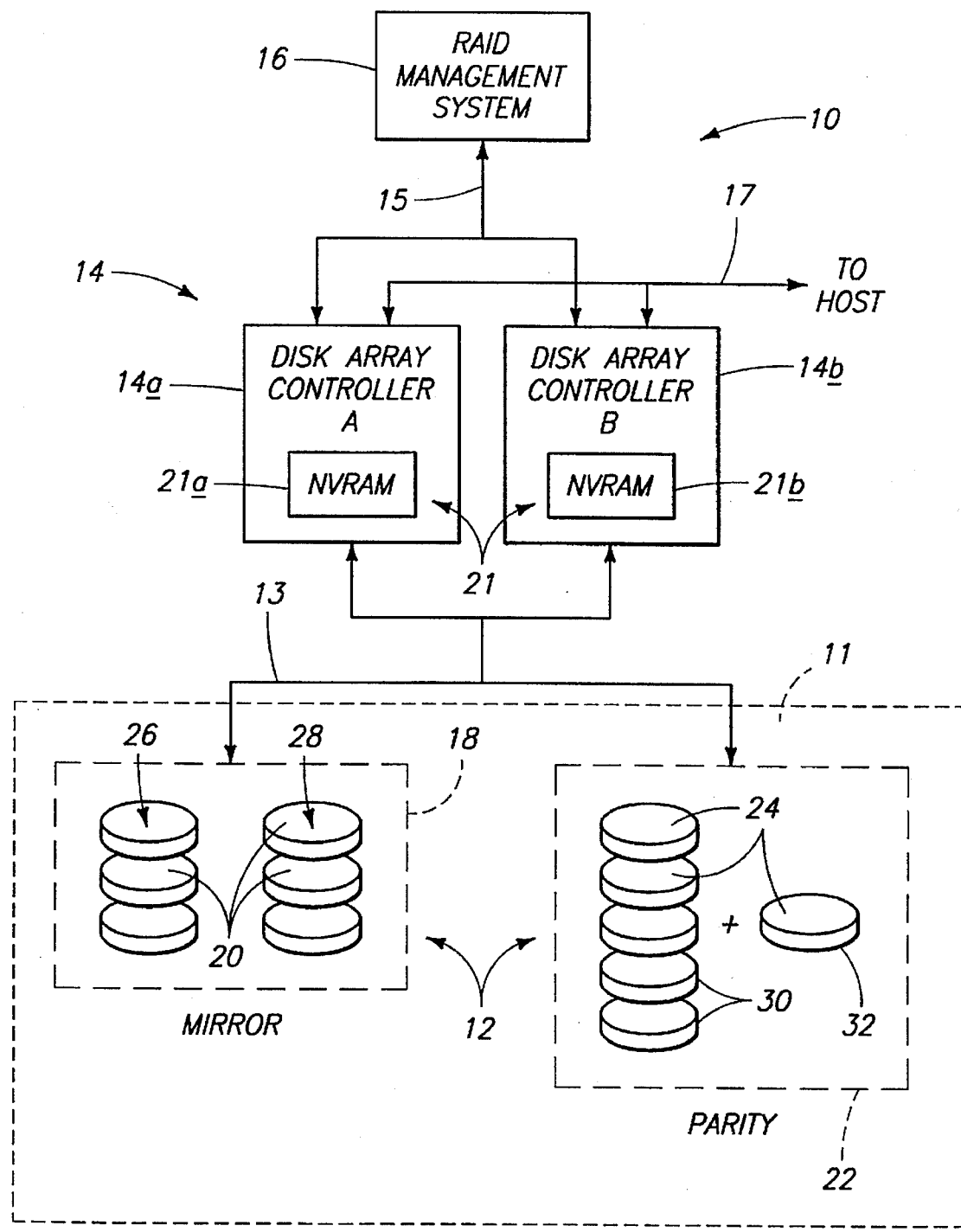
FIG. 1 is a diagrammatic block diagram of a disk array data storage system according to this invention.
Figure 11B:
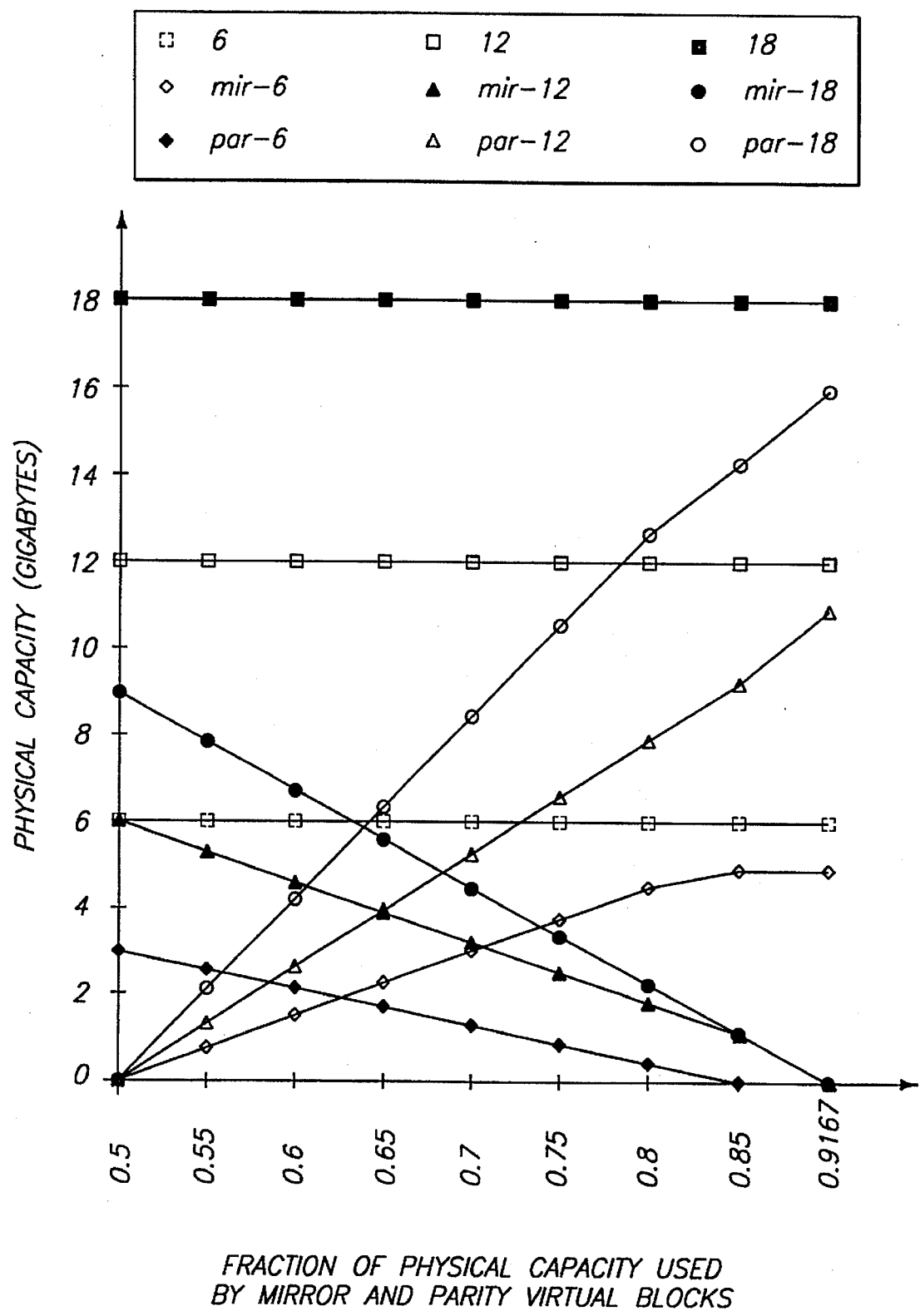

FIG. 1 shows a data storage system 10 constructed according to this invention. Preferably, data storage system 10 is a disk array data storage system which includes a hierarchic disk array 11 having a plurality of storage disks 12, a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs (Programmable Read Only Memories), EPROMs (Erasable Programmable Read Only Memories), and EEPROMs (Electrically Erasable Programmable Read Only Memories)). The term "disk array" means a collection of disks, the hardware required to connect them to one or more host computers, and management software used to control the operation of the physical disks and present them as one or more virtual disks to the host operating environment. A "virtual disk" is an abstract entity realized in the disk array by the management software.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14 or within the host computer to provide a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. Dual controllers 14a and 14b enhance reliability by providing continuous backup and redundancy in the event that one controller becomes inoperable. This invention can be practiced, however, with a single controller or other architectures.

The hierarchic disk array 11 can be characterized as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID level 1, and other areas can be allocated for a second reliability storage level, such as parity or RAID level 5. The various mapping techniques and virtual spaces concerning RAID levels are described below in more detail.

Data storage system 10 includes a memory map store 21 that provides for persistent storage of the virtual mapping information used to map different storage spaces onto one another. The memory map store is external to the disk array, and preferably resident in the disk array controller 14. The memory mapping information can be continually or periodically updated by the controller or RAID management system as the various mapping configurations among the different views change.

Preferably, the memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to the data storage system 10. One preferred construction is a self-refreshing, battery-basked DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, disk array 11 has multiple storage disk drive devices 12. Example sizes of these storage disks are one to three Gigabytes. The storage disks can be independently connected or disconnected to mechanical bays that provide interfacing with SCSI bus 13. In one implementation, the data storage system is designed with twelve active mechanical bays. Four SCSI buses are used to interface these bays with disk array controller 14 (i.e., one bus per three mechanical bays). If the active bays are fully loaded, the data storage system has an example combined capacity of 12–36 Gigabytes. Disk array controller 14 recognizes storage disks 12 regardless into which bay they are plugged. The data storage system 10 is designed to permit "hot plug" of additional disks into available mechanical bays in the disk array while the disk array is in operation.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

| | |
|---|---|
| $P_0$ | = Segment 0 $\oplus$ Segment 1 $\oplus$ Segment 2 |
| | = Disk 0 $\oplus$ Disk 1 $\oplus$ Disk 2 |
| $P_1$ | = Segment 3 $\oplus$ Segment 4 $\oplus$ Segment 5 |
| | = Disk 0 $\oplus$ Disk 1 $\oplus$ Disk 3 |
| $P_2$ | = Segment 6 $\oplus$ Segment 7 $\oplus$ Segment 8 |
| | = Disk 0 $\oplus$ Disk 2 $\oplus$ Disk 3 |
| $P_3$ | = Segment 9 $\oplus$ Segment 10 $\oplus$ Segment 11 |
| | = Disk 1 $\oplus$ Disk 2 $\oplus$ Disk 3 |

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. The regions are grouped together to form RAID areas in one virtual view of the storage space. Additionally, another (host-defined) view of storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 tries to place the more performance-critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently accessed data is maintained in the mirror RAID area 18 while the less recently accessed data is stored in parity RAID area 22. Other performance protocols may be employed. Ideally, such protocols are defined based upon the specific computer application and the needs of the user.

Additionally, the RAID management system 16 automatically "tunes" the storage resources of a data storage system according to a function of two parameters: size of the physical storage capacity and size of the present amount of user data being stored in the data storage system. Initially, all data is stored in mirror RAID areas because this affords the highest performance and reliability. As more data is added to the data storage system, the data is migrated between mirror RAID areas and parity RAID areas to optimize performance and reliability. As the data storage system approaches full capacity, more and more data is migrated to parity RAID areas in an effort to meet all demands by the user while still providing reliability through redundancy. Accordingly, the data storage system of this invention affords maximum flexibility and adaptation. It does not require the user to select a specific storage regime, but instead can adapt to any demand placed on it by the user.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. Example storage capacities for such disks are 1–3 Gigabytes. The storage space 34 is partitioned into areas A0, A1, A2, etc. Individual areas contain numerous stripes, such as stripes 0–Q in area A0. Individual areas also contain numerous regions 35. Regions 35 preferably consist of a selected number of uniform sized segments on every storage disk so that the regions are equal in size across the entire disk array. An example size of one region 35 is one Megabyte.

The storage space of the disks are mapped into a first, intermediate, RAID-level virtual view 40 of the physical storage space 34. This first virtual view is conceptually a set of RAID areas which can be mapped to a second application view that represents a contiguously addressable storage space. The physical configuration and RAID views of the storage space are hidden from the application view.

The RAID area storage space 40 is the view of storage that identifies the mirror and parity storage space. For instance, a RAID area 42 may represent a mirror RAID area of M allocation blocks 43 while RAID area 44 may represent a parity RAID area of N allocation blocks 45. The allocation blocks 43 and 45 are preferably equal sized, with an example size being 64 Kilobytes. These RAID areas relate to corresponding physical areas A0, A1, A2, etc., on the physical storage space 34. As an example, sixteen 64K allocation blocks 43 or 45 at the RAID virtual view can be mapped onto a single 1M region 35.

The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area. It is also noted that the RAID areas are shown as being mapped into contiguous areas on the disk array, where each region associated with a RAID area is located at the same physical address on each storage disk. The RAID areas may alternatively be mapped into noncontiguous areas on the disk array as well.

The storage space available in the RAID areas is mapped into a second, front end, application-level virtual view 50 which is a view of storage as defined by and presented to the user or host application program. When viewed by the user or host application program, the application-level virtual view 50 can represent a single large storage capacity indicative of the available storage space on storage disks 12. Virtual storage space 50 presents a view of a linear set of equal sized storage virtual blocks 52 and 53, referenced individually as 0, 1, 2, . . . J–1, J, J+1, . . . , L–1, L, L+1, . . . , etc. Virtual blocks 52 and 53 are preferably the same size as the allocation blocks in RAID area 40, with an example size being 64 Kilobytes. The virtual block storage space 50 is represented by a table of references or pointers (as represented by arrows 54) to allocation blocks in the view presented by RAID areas 40. Virtual blocks 52 and 53 at the application virtual view 50 are therefore associated with allocation blocks 43 and 45 at the RAID virtual view 40 via the pointers maintained in the virtual block table. There are at least two types of RAID areas that can be referenced from the virtual block table: mirror and parity.

The RAID management system 16 can dynamically alter the configuration of the RAID areas over the physical storage space. The number of RAID areas for each type may be increased or decreased depending upon the amount of user data being stored in the system and the size of the physical disk storage space. As a result, the mapping of the RAID areas in the RAID-level virtual view 40 onto the disks and the mapping of the front end virtual view 50 to RAID view 40 are generally in a state of change. The memory map store in NVRAMs 21a and 21b (FIG. 1) maintains the current mapping information used by RAID management system 16 to map the RAID areas onto the disks, as well as the information employed to map between the two virtual views. As the RAID management system dynamically alters the RAID level mappings, it also updates the mapping information in the memory map store to reflect the alterations.

The migration operation of memory system 10 will now be described with reference to FIGS. 1 and 4.

For purposes of continuing explanation, virtual blocks 53 of the application-level virtual storage space 50 reference associated allocation blocks 45 in parity RAID area 44 stored in area A1 of physical storage space 34. Such virtual blocks 53 are referred to as "parity virtual blocks" while the associated allocation blocks 45 are referred to as "parity allocation blocks". Similarly, virtual blocks 52 reference associated allocation blocks 43 in mirror RAID area 42 stored in area A0 of physical storage space 34. Such virtual blocks 52 are referred to herein as "mirror virtual blocks" while the associated allocation blocks 43 are referred to as "mirror allocation blocks".

In general, to migrate data from one RAID area to another, a virtual block associated with an allocation block of a first RAID level type (such as mirror or Level 1) is selected. Then, an unused allocation block representing a second RAID level type (such as parity or Level 5) is located. If an unused allocation block cannot be located, one is created. Data is next transferred from the allocation block previously associated with the selected virtual block to the unused allocation block which causes the data to undergo a redundancy level change. For example, data once stored according to mirror redundancy would now be stored according to parity redundancy, or vice versa. As a final step, the mapping 54 of the application-level virtual storage space 50 to the RAID-level virtual storage space 40 is modified and updated to reflect the shift of data. The selected virtual block that was formerly associated with an allocation block of the first RAID level type now references via an updated pointer an allocation block of the second RAID level type which contains the migrated data. Any mapping change occurring during this transaction would be updated in memory map store 21.

The continuing discussion provides a more detailed explanation of migrating data between mirror and parity storage areas according to preferred methods and sequences of this invention. To migrate data from parity to mirror storage, the following sequence is employed:

1. The RAID management system locates an unused mirror allocation block 43 in a mirror RAID area 42.

2. If none can be found, the RAID management system creates a mirror allocation block (discussed below).

3. The RAID management system suspends new storage requests to the virtual block to be migrated.

4. The RAID management system waits until all active data storage requests to the virtual block are completed.

5. The data from the parity allocation block 45 associated with virtual block 53 is read into a temporary memory buffer.

6. The data is then written to the mirror allocation block 43 chosen in step 2.

7. The virtual block table is modified to reference the new location of the data in the mirror allocation block 43.

8. The suspended storage requests are resumed.

According to the above procedure, a virtual block 53 in the application-level virtual view 50 migrated from parity to mirror storage. Relative to the intermediate virtual view 40, data has migrated from a parity allocation block 45 in parity RAID area 44 to a mirror allocation block 43 in mirror RAID area 42. In the physical storage space data has moved from area A1 to area A0.

If an unused mirror allocation block cannot be located (step 1 above), the RAID management system tries the following preferred sequence of three techniques. First, the RAID management system will try to locate an unused (and thus undesignated) RAID area, which can be converted to a mirror RAID area without violating the system threshold of unused RAID-level storage that is needed to guarantee that migration can always proceed. If this fails and the system has more than the reserved amount of unused RAID-level storage, the system migrates data within parity storage to collect unused parity allocation blocks into unused RAID areas. If this migration yields an unused RAID area that can be converted to a mirror RAID area as above, then the system converts it to a mirror RAID area. Otherwise, the system alternately migrates data from mirror to parity storage, packs mirror storage, and converts unused RAID-level storage to parity until the system increases unused RAID-level storage sufficiently for the location of an unused mirror allocation block or a conversion of an unused RAID area to a mirror RAID area. Since mirror allocation blocks occupy more physical storage space than parity allocation blocks, this last technique will result in a net increase in the amount of unused RAID-level storage.

The creation/conversion protocol used to locate and establish unused mirror allocation blocks is advantageous because it permits the RAID management system to selectively adjust the memory allocation between parity and mirror areas according to the amount of user data and the size of physical storage space. As data usage and storage capacity vary, the RAID management system employs one or more of the above three techniques to maximize the amount of data held in mirror storage.

The RAID management system attempts to avoid the situation in which a storage request must wait for the space-making sequence to yield an unused mirror allocation block by creating unused RAID areas during idle time. However, in some situations, storage requests may be suspended during the space-making sequence. The RAID management system configures the virtual block storage space in such a way that the virtual space will be smaller than the RAID view. This ensures that a free space equal to at least one RAID area is set aside for migration or other purposes. In this manner, the sequence of techniques will always yield an unused mirror allocation block.

To migrate data from mirror to parity storage, the following sequence is employed:

1. The RAID management system chooses a virtual block from 52 to migrate from mirror to parity storage according to a migration policy such as access recency or access frequency.

2. The RAID management system locates an unused parity allocation block 45 in a parity RAID area 44.

3. If such a block cannot be found, space reserved for migration is converted to a parity RAID area according to the above described creation techniques.

4. New storage requests to the virtual block to be migrated are suspended.

5. The RAID management system waits until all active storage requests to the virtual block are completed.

6. Data is read from the mirror allocation block 43 associated with virtual block 52 into a temporary memory buffer.

7. The data is written to the chosen parity allocation block 45.

8. The virtual block table is modified to reference the new location of the data in parity allocation block 45.

9. Data requests to the virtual block are resumed.

The above two enumerated sequences provide examples of how the memory system of this invention can operate to migrate data between two different levels of redundancy.

To accomplish the data migration, one goal of the data storage system is to ensure that a sufficient amount of storage space is reserved for migration. Additionally, another goal is to keep as much user data in mirror storage as possible because mirror redundancy offers the highest performance and reliability. However, there is only a finite amount of physical storage space in the disk array. Virtual blocks in mirror storage begin to consume the physical capacity as data is stored in the disk array. The term "physical capacity" refers to the storage capacity available for storing user data and its redundancy information.

Mirror storage effectively clogs the disk array when it consumes one-half of the physical capacity minus the reserved storage space. At this point, all used virtual blocks are kept in mirror storage. If the mirror storage consumes so much of the physical storage space that the amount of unused RAID space is less than that of a RAID area, the data storage system can no longer guarantee migration of single virtual blocks from mirror to parity RAID areas. The next client data request that uses a previously unused virtual block will fail since the amount of unused space is less than that of a RAID area and cannot be converted to parity storage for migrating single virtual blocks out of mirror storage. This situation must be avoided.

RAID management system 16 therefore allots a sufficient amount of reserved storage space for data migration. This is done through a combination of two techniques. First, the RAID management system logically reserves an amount of storage space equivalent to at least one mirror RAID area. Second, the RAID management system limits the number of blocks that can be allocated to mirror storage within the data storage system. The maximum number of virtual blocks in mirror storage is dynamically computed based upon a function of the physical capacity of the storage disks, the number of storage disks, and the allocated capacity at the time of each storage request from the user.

FIG. 5 provides a flow diagram of an initialization method of this invention for reserving storage space for data migration. The steps are described with additional reference to FIGS. 1 and 4.

The first two steps 100 and 102 establish the two-tier virtual storage space environment for the hierarchic data storage system. At step 100, RAID management system 16 maps the physical storage space provided by disk array 12 into a RAID-level virtual storage space 40. This RAID-level virtual storage space presents the physical storage space as mirror and parity RAID areas. The mirror RAID areas contain multiple mirror allocation blocks that store data according to mirror redundancy or RAID Level 1. The parity RAID areas contain multiple parity allocation blocks that store data according to parity redundancy or RAID Level 5. At step 102, the RAID management system maps the RAID-level virtual storage space 40 into an application-level virtual storage space 50 which presents the physical storage space as multiple virtual blocks. The virtual blocks are associated with corresponding allocation blocks in RAID areas of the RAID-level virtual storage space via the pointers maintained in the virtual block table. As explained above with reference to FIG. 4, the virtual blocks can be migrated between mirror and parity storage as desired.

During the initial mapping, the RAID management system purposefully maps less than the full physical capacity of the physical storage space into the first and second virtual storage space. In this manner, the respective capacities of the first and second virtual storage spaces are each less than the total physical capacity. This permits a logical reservation of an amount of space that will not be committed to the user for storing data (step 104). Preferably, an amount of space equivalent to at least one RAID area is reserved. That space is typically distributed throughout the storage disks in a noncontiguous manner. When needed for migration, the space is gathered into unused RAID areas.

At step 106, the physical capacity (PhyCap) of the physical storage space in the disk array is ascertained. This is a fixed value for a given disk array configuration, minus the reserved space. For example, if the disk array has twelve one-Gigabyte storage disks, the physical capacity would be essentially twelve Gigabytes (less the amount of one RAID area). The data storage system derives this value internally by detecting the presence and size of each storage disk. When there is a change in physical configuration, such as when storage disks are plugged in or removed from the system, the data storage system provides a new value for the physical capacity (PhyCap).

It is desirable that at least some mirror storage be maintained at all times to provide higher performance through the caching of important data. The RAID management system sets aside an arbitrary percentage of user data to be stored in mirror storage (step 108). One example is up to 10% of the user data will be maintained in mirror storage. Storage in mirror RAID areas is beneficial because mirror redundancy affords higher performance and reliability than parity redundancy.

During this system initialization, all virtual blocks in the application-level virtual storage space 50 are unallocated. Allocated capacity is set to zero. The term "allocated capacity" means the amount of user data stored in the virtual blocks in the application-level virtual storage space 50. At step 110, the RAID management system computes a maximum allowable number of virtual blocks that are available to the user given that a minimum percentage of user data is to be maintained in mirror storage.

FIG. 6 shows a flow diagram of a method for ensuring that mirror storage never consumes the physical storage capacity. At step 112, virtual blocks of data are being created or moved. Initially, when data is first being stored in the system, virtual blocks in the application-level virtual storage space 50 are allocated in mirror RAID areas. That is, the virtual blocks are associated with mirror allocation blocks via the pointers in the virtual block table. The virtual blocks are allocated as needed based upon requests made by the user. All data is preferably stored in virtual blocks associated with the mirror RAID areas until the allocated capacity exceeds one-half the total physical capacity of the disk array.

As data continues to be stored in disk array 11, RAID management system 16 maintains a count of the virtual blocks that are presently storing user data. This count, which is easily presented in terms of capacity or size, represents the allocated capacity (AllCap) at any given time (step 114). At decision block 116, the allocated capacity (AllCap) is compared to the physical capacity (PhyCap) of the disk array. If the allocated capacity is less than or equal to one-half physical capacity (i.e., the "no" branch from step 116), data continues to be stored only in virtual blocks in mirror storage (step 118).

When the allocated capacity is greater than or equal to the physical capacity (i.e., the "yes" branch from step 116), the RAID management system computes the maximum allowable number of virtual blocks in mirror storage for the present situation (step 120). This computation is a function of allocated capacity (AllCap), physical capacity (PhyCap) of the disk array, and the number of disks in the disk array (n). This maximum value is dynamically computed as conditions change. That is, one variable—allocated capacity—is typically in a state of continuous change and thus, the maximum allowable number of virtual blocks in mirror storage is recomputed as this variable changes.

The computation employs slightly different functions depending upon whether the disk array is homogenous or heterogenous. A "homogeneous" disk array consists of equal sized storage disks. A "heterogeneous" disk array consists of storage disks of different sizes. For the homogeneous disk array, the RAID management system computes the maximum number of virtual blocks in mirror storage using the following equation [1]:

$$\max = \text{AllCap} - 2\left(\frac{n-1}{n-2}\right)\left(\text{AllCap} - \frac{1}{2}\text{PhyCap}\right)$$

where "n" equals the number of storage disks in the array, "AllCap" represents the allocated capacity, and "PhyCap" represents the physical capacity of the disk array.

For a heterogeneous disk array, the RAID management system first divides the disk array into homogeneous-like disk array representations. For example, suppose the heterogeneous disk array consisted of four one-Gigabyte storage disks and two three-Gigabyte storage disks. The RAID management system might divide that configuration into two homogenous disk array representations where one representation comprises one Gigabyte of storage on all six disks and the other representation comprises the remaining two Gigabytes of storage on the two three-Gigabyte disks. The RAID management system then computes the maximum number of virtual blocks in mirror storage for the heterogeneous disk array using the following equation [2]:

$$\max = \text{AllCap} - \sum_i 2\frac{n_i-1}{n_i-2}\left(\text{AllCap}_i - \frac{1}{2}\text{PhyCap}_i\right)$$

where i is the number of homogeneous disk array representations that can be created from the heterogeneous disk array.

The RAID management system restricts allocation of any more virtual blocks to mirror storage beyond the maximum allowable number. At step 122, it is determined whether new allocation of virtual blocks or migration of virtual blocks from parity to mirror storage exceeds the maximum allowable number of virtual blocks in mirror storage. If not (i.e., the "no" branch from step 122), data can be stored in the virtual blocks associated with mirror storage (step 118). On the other hand, if the maximum allowable number will be exceeded (i.e., the "yes" branch from step 122), the RAID management system migrates virtual blocks from mirror to parity storage. That is, data is moved from mirror allocation blocks to parity allocation blocks in the RAID-level virtual storage space 40 and the pointers in the virtual block table are updated so that the virtual blocks in the application-level virtual storage space 50 effectively migrate from mirror storage to parity storage.

The RAID management system can migrate data from mirror allocation blocks to parity allocation blocks using the reserved space whose presence is ensured by restricting the number of virtual blocks in mirror storage. Additionally, by dynamically computing the maximum number of virtual blocks, the RAID management system maintains the number of virtual blocks in mirror storage between the computed maximum and the preset minimum.

By limiting the number of virtual blocks in mirror storage, the system prevents the physical storage space from being entirely consumed by such virtual blocks. This practice effectively prevents the unused physical capacity from falling below the logically reserved amount to thereby ensure that data migration between parity and mirror RAID areas is always available.

As more data is stored in the disk array, the allocated capacity approaches the physical capacity. To accommodate the user requests for handling large volumes of data, the RAID management system continues to migrate data from mirror RAID areas to parity RAID areas. As a result, the proportion of data stored in mirror RAID areas to data stored in parity RAID areas gradually decreases.

FIGS. 7 and 8 illustrate the practical effects of the method of this invention. FIG. 7 graphs the case of a homogenous disk array having three different sizes of physical capacity: 3, 6, and 12 Gigabytes. The inverted "V" shaped plot for each scenario represents the maximum allowable number of virtual blocks in mirror storage computed by equation [1] above in relation to the increasing amount of data stored in the disk array. In each scenario, the maximum allowable number of virtual blocks in mirror storage grows from zero to one-half of the physical storage capacity. Data is initially stored only in mirror storage. Once the amount of user data meets and exceeds this one-half threshold (as indicated by the fractional amount 0.5), the maximum allowable number of virtual blocks in mirror storage begins to decrease. Fewer and fewer virtual blocks are allocated to mirror storage as the volume of data storage on the disk array approaches full capacity. It is noted that while the virtual blocks in mirror storage are shrinking in number, more virtual blocks in parity storage are being used to store data. This is better seen in FIG. 8.

FIG. 8 graphs the case of a heterogeneous disk array having three different sizes of physical capacity: 6, 12, and 18 Gigabytes. There are three pairs of curves associated with these three size scenarios as indicated by the legend at the top of the graph. The negatively sloped curves plot the amount of storage using virtual blocks in mirror storage and the positively sloped curves plot the amount of storage using virtual blocks in parity storage. Notice that the origin coordinate for the x-axis is 0.5, signifying that the system is already half filled at that point. As the disk array continues to fill with data beyond one-half capacity, the maximum allowable number of virtual blocks in mirror storage steadily declines to effectively zero (although, it is desirable to keep at least some small percentage of virtual blocks in mirror storage). At the same time, the number of virtual blocks in parity storage inversely increases toward full capacity.

These graphs concisely summarize the preferred storage and migration policies of this invention. Data is initially stored entirely in mirror storage. At half capacity, the hierarchic data storage system begins storing data in both mirror and parity storage using data migration between the types. As the data storage system continues to fill, proportionally more data is migrated to parity storage to accommodate the increasing volume of data while mirror storage decreases. At each of these stages, the maximum allowable number of virtual blocks in mirror storage is computed so that the number of existing virtual blocks in mirror storage are consistently limited below this value to ensure reservation of sufficient space for data migration.

The following discussion provides typical applications of the methods during operation of the hierarchic data storage system. In each application, the RAID management system computes the maximum allowable number of virtual blocks in mirror storage for analysis of migration possibilities. Each application assumes that more than one-half of the physical storage space is being utilized.

Application 1: The user requests to access a virtual block that is presently associated with parity storage. This request causes migration of the virtual block from parity to mirror storage. The maximum allowable number of virtual blocks in mirror storage is computed. If the actual number of existing virtual blocks in mirror storage equals the maximum allowable number, the least recently accessed (or least frequently accessed) virtual blocks in mirror storage are migrated to parity storage. This reduces the number of virtual blocks in mirror storage below the maximum allowable number. Thereafter, the requested virtual block can be accessed.

Application 2: The user requests to write data to a previously unused virtual block. The RAID management system again computes the maximum allowable number of virtual blocks in mirror storage and compares the result to the actual number of existing virtual blocks in mirror storage. If the actual number exceeds the maximum allowable number, virtual blocks are migrated from mirror storage to parity storage to free up space in mirror storage to receive the new data.

Application 3: The user adds a storage disk to the system to increase the amount of physical capacity. As the physical storage space from the new storage disk is incorporated, the RAID management system computes a new maximum number based upon the enlarged capacity. Since it is desired to store as much data as possible in mirror RAID areas, the more recently used (or more frequently accessed) virtual blocks are migrated from parity storage to mirror storage until the actual number of existing virtual blocks in mirror storage reaches the maximum allowable number.

The invention has many benefits. First, it provides a straightforward approach to limiting mirror storage allocation. This eliminates the most dynamic source of overcommitment in the system. Second, the system does not need to be designed to support nested transactions which guarantee a specific location or configuration of space reserved for migration. Third, the system permits maximum flexibility to storage type sizes by easily adapting to homogeneous or heterogenous disk arrays. Fourth, the system optimizes performance and reliability by continually maintaining as much data as possible in mirror storage.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for reserving space in a hierarchic data storage system; the data storage system comprising a disk array with a number of storage disks that define a physical storage space of a physical capacity, the physical storage space being mapped into a RAID-level virtual storage space having mirror and parity RAID areas, the RAID-level virtual storage space being mapped into an application-level virtual storage space having multiple virtual blocks which are associated with the mirror and parity RAID areas; the method comprising the following steps:

(a) allocating virtual blocks in the application-level virtual storage space in mirror RAID areas for storing data according to mirror redundancy;

(b) storing data in the virtual blocks;

(c) determining an allocated capacity representing a total number of virtual blocks that are presently being used to store data; and (d) dynamically computing a maximum allowable number of virtual blocks in mirror RAID areas as a function of the physical capacity, the allocated capacity, and the number of storage disks in the disk array in response to changes in the allocated capacity.

2. A method according to claim 1 further comprising the additional step of restricting allocation of more virtual blocks in mirror RAID areas than the computed maximum allowable number of virtual blocks in mirror RAID areas to thereby ensure space reservation for data migration between parity and mirror RAID areas.

3. A method according to claim 2 further comprising the following additional steps:

allocating the virtual blocks in the application-level virtual storage space in parity RAID areas for storing data according to parity redundancy; and migrating virtual blocks between mirror and parity storage using reserved space ensured by restricting allocation of virtual blocks in mirror RAID areas.

4. A method according to claim 1 further comprising the additional step of initially reserving an amount of physical storage space equivalent to at least one mirror RAID area.

5. A method according to claim 1 further comprising the following additional steps:

in the event that the number of virtual blocks in mirror RAID areas is less than the maximum allowable number, storing data only in the virtual blocks in mirror RAID areas; and in the event that the number of virtual blocks in mirror RAID areas exceeds the maximum allowable number, allocating the virtual blocks in the application-level virtual storage space in parity RAID areas for storing data according to parity redundancy; and storing data in virtual blocks in both the mirror and parity RAID areas.

6. A method according to claim 1 further comprising the following additional steps:

allocating the virtual blocks in the application-level virtual storage space in parity RAID areas for storing data according to parity redundancy;

storing data in virtual blocks in both the mirror and parity RAID areas; and as more data is stored in the disk array such that the allocated capacity approaches the physical capacity, migrating virtual blocks from mirror RAID areas to parity RAID areas to produce a decreasing proportion of data stored in mirror RAID areas to data stored in parity RAID areas.

7. A method according to claim 6 further comprising the additional step of maintaining a minimum number of virtual blocks in mirror RAID areas.

8. A method according to claim 1 further comprising the following additional steps:

comparing the allocated capacity to the physical capacity; and computing the maximum allowable number in step (d) only in the event that the allocated capacity is greater than or equal to one-half of the physical capacity.

9. A computer-readable medium having computer-executable instructions for performing the steps in the method recited in claim 1.

10. A method for reserving space in a hierarchic data storage system; the data storage system comprising a disk array of multiple storage disks that define a physical storage space; the method comprising the following steps:

(a) providing a physical capacity of the physical storage space in the disk array;

(b) mapping the physical storage space into a RAID-level virtual storage space having multiple mirror and parity RAID areas;

(c) mapping the RAID-level virtual storage space into an application-level virtual storage space having multiple virtual blocks;

(d) allocating the virtual blocks in the application-level virtual storage space in mirror RAID areas for storing data according to mirror redundancy;

(e) storing data in the virtual blocks;

(f) determining an allocated capacity representing a total number of virtual blocks that are presently being used to store data;

(g) comparing the allocated capacity to the physical capacity; and (h) if the allocated capacity is greater than or equal to one-half of the physical capacity, conducting the following steps:

(1) dynamically computing a maximum allowable number of virtual blocks in mirror RAID areas as a function of the physical capacity and the allocated capacity in response to changes in the allocated capacity;

(2) restricting allocation of more virtual blocks in mirror RAID areas than the computed maximum allowable number of virtual blocks in mirror RAID areas;

(3) allocating the virtual blocks in the application-level virtual storage space in parity RAID areas for storing data according to parity redundancy; and (4) storing data in virtual blocks in both the mirror and parity RAID areas.

11. A method according to claim 10 wherein the mapping steps (b) and (c) yield RAID-level and application-level virtual storage spaces that have respective capacities which are less than the capacity of the physical storage space to logically reserve an amount of space that is not committed for use by a user.

12. A method according to claim 10 further comprising the additional step of maintaining a minimum number of virtual blocks in mirror RAID areas.

13. A method according to claim 10, wherein as more data is stored in the disk array such that the allocated capacity approaches the physical capacity, migrating virtual blocks from mirror RAID areas to parity RAID areas to produce a decreasing proportion of data stored in mirror RAID areas to data stored in parity RAID areas.

14. A hierarchic data storage system comprising:

a disk array having a number of storage disks that define a physical storage space;

a disk array controller coupled to the disk array for coordinating data transfer to and from the disks;

a RAID management system operatively coupled to the disk array controller for mapping a RAID-level virtual storage space into the physical storage space of the storage disks; the RAID-level virtual storage space having multiple mirror and parity RAID areas;

the RAID management system allocating virtual blocks in mirror RAID areas for storing data according to mirror redundancy and virtual blocks in parity RAID areas for storing data according to parity redundancy, the RAID management system maintaining a count of the virtual blocks; and the RAID management system being configured to dynamically compute a maximum allowable number of virtual blocks in the mirror RAID areas as a function of the physical capacity, the allocated capacity based on the count of virtual blocks, and the number of storage disks in response to changes in the allocated capacity.

15. A hierarchic data storage system comprising:

a homogenous disk array having a number of equal sized storage disks that define a physical storage space;

a disk array controller coupled to the disk array for coordinating data transfer to and from the disks;

a RAID management system operatively coupled to the disk array controller for mapping a RAID-level virtual storage space into the physical storage space of the storage disks; the RAID-level virtual storage space having multiple mirror and parity RAID areas;

the RAID management system allocating virtual blocks in mirror RAID areas for storing data according to mirror redundancy and virtual blocks in parity RAID areas for storing data according to parity redundancy, the RAID management system maintaining a count of the virtual blocks; and the RAID management system being configured to dynamically compute a maximum allowable number of virtual blocks in the mirror RAID areas according to the following equation:

$$\max = \text{AllCap} - 2\left(\frac{n-1}{n-2}\right)\left(\text{AllCap} - \frac{1}{2}\text{PhyCap}\right)$$

where "n" equals the number of storage disks in the disk array, "AllCap" represents the allocated capacity based on the count of the virtual blocks, and "PhyCap" represents the physical capacity of the disk array.

16. A hierarchic data storage system comprising:

a heterogeneous disk array having a number of various sized storage disks that define a physical storage space;

a disk array controller coupled to the disk array for coordinating data transfer to and from the disks;

a RAID management system operatively coupled to the disk array controller for mapping a RAID-level virtual storage space into the physical storage space of the storage disks; the RAID-level virtual storage space having multiple mirror and parity RAID areas;

the RAID management system allocating virtual blocks in mirror RAID areas for storing data according to mirror redundancy and virtual blocks in parity RAID areas for storing data according to parity redundancy, the RAID management system maintaining a count of the virtual blocks; and the RAID management system being configured to dynamically compute a maximum allowable number of virtual blocks in the mirror RAID areas according to the following equation:

$$\max = \text{AllCap} - \sum_i 2\frac{n_i-1}{n_i-2}\left(\text{AllCap}_i - \frac{1}{2}\text{PhyCap}_i\right)$$

where "n" equals the number of storage disks in the disk array, "AllCap" represents the allocated capacity based on the count of the virtual blocks, "PhyCap" represents the physical capacity of the disk array, and "i" is the number of homogenous disk array representations that can be created from the heterogeneous disk array.

17. A method for reserving space in a hierarchic data storage system; the data storage system comprising a homogeneous disk array with a number of equal sized storage disks that define a physical storage space of a physical capacity, the physical storage space being mapped into a RAID-level virtual storage space having mirror and parity RAID areas, the RAID-level virtual storage space being mapped into an application-level virtual storage space having multiple virtual blocks which are associated with the mirror and parity RAID areas; the method comprising the following steps:

allocating virtual blocks in the application-level virtual storage space in mirror RAID areas for storing data according to mirror redundancy;

storing data in the virtual blocks;

determining an allocated capacity representing a total number of virtual blocks that are presently being used to store data; and computing a maximum allowable number of virtual blocks in the mirror RAID areas according to the following equation:

$$\max = \text{AllCap} - 2\left(\frac{n-1}{n-2}\right)\left(\text{AllCap} - \frac{1}{2}\text{PhyCap}\right)$$

where "n" equals the number of storage disks in the disk array, "AllCap" represents the allocated capacity based on the count of the virtual blocks, and "PhyCap" represents the physical capacity of the disk array.

18. A computer-readable medium having computer-executable instructions for performing the steps in the method recited in claim 17.

19. A method for reserving space in a hierarchic data storage system; the data storage system comprising a heterogeneous disk array with a number of various sized storage disks that define a physical storage space of a physical capacity, the physical storage space being mapped into a RAID-level virtual storage space having mirror and parity RAID areas, the RAID-level virtual storage space being mapped into an application-level virtual storage space having multiple virtual blocks which are associated with the mirror and parity RAID areas; the method comprising the following steps:

allocating virtual blocks in the application-level virtual storage space in mirror RAID areas for storing data according to mirror redundancy;

storing data in the virtual blocks;

determining an allocated capacity representing a total number of virtual blocks that are presently being used to store data; and computing a maximum allowable number of virtual blocks in the mirror RAID areas according to the following equation:

$$\max = \text{AllCap} - \sum_i 2 \frac{n_i - 1}{n_i - 2} \left( \text{AllCap}_i - \frac{1}{2} \text{PhyCap}_i \right)$$

where "n" equals the number of storage disks in the disk array, "AllCap" represents the allocated capacity, "PhyCap" represents the physical capacity of the disk array, and "i" is the number of homogenous disk array representations that can be created from the heterogeneous disk array.

20. A computer-readable medium having computer-executable instructions for performing the steps in the method recited in claim 19.

* * * * *